United States Patent [19]

Nordholt et al.

[11] 4,414,690
[45] Nov. 8, 1983

[54] ACTIVE AERIAL

[75] Inventors: Ernst H. Nordholt, Bleiswijk; Durk Van Willigen, Reeuwijk, both of Netherlands

[73] Assignee: U.S. Philips Corporation, New York, N.Y.

[21] Appl. No.: 273,796

[22] Filed: Jun. 15, 1981

[30] Foreign Application Priority Data

Jun. 20, 1980 [NL] Netherlands ............ 8003566

[51] Int. Cl.³ .................. H04B 1/10; H04B 1/18; H03F 1/36; H01Q 1/26
[52] U.S. Cl. .................. 455/283; 455/291; 330/79; 330/102; 343/701
[58] Field of Search .............. 455/283, 290–293, 455/311, 341, 284, 287, 289, 297; 330/79, 102, 105, 107, 260, 294; 343/854, 701, 850

[56] References Cited

U.S. PATENT DOCUMENTS

| 3,134,080 | 5/1964 | Story ........................ 330/102 |
| 3,582,791 | 6/1971 | Slavin ....................... 455/291 |
| 3,827,053 | 7/1974 | Willie et al. ............... 455/283 |
| 3,972,002 | 7/1976 | Aprille, Jr. ................ 330/102 |
| 4,087,737 | 5/1978 | De Gennaro .............. 330/107 |
| 4,103,241 | 7/1978 | Najork ....................... 455/289 |
| 4,253,070 | 2/1981 | Carlsen ...................... 330/260 |
| 4,314,378 | 2/1982 | Fowler et al. ............. 455/291 |

FOREIGN PATENT DOCUMENTS

| 2115657 | 10/1972 | Fed. Rep. of Germany ...... 343/701 |
| 7901901 | 9/1979 | Netherlands ...................... 343/701 |

Primary Examiner—Jin F. Ng
Attorney, Agent, or Firm—Thomas A. Briody; William J. Streeter; Edward W. Goodman

[57] ABSTRACT

An active aerial for use in car radios and aerial "arrays" comprising an aerial element and an aerial connected thereto. In order to obtain a low distortion and a good signal-to-noise ratio in spite of the presence of protection diodes to prevent overloading of the amplifier by atmospherics and in spite of contamination of the aerial etc, the input of the active portion of the amplifier is virtually grounded. To this end, the amplifier is preferably an operational amplifier having a high gain factor, the signal input of which is connected to ground, both the signal coming from the aerial element and a signal fed back from an output of the amplifier being applied to the inverting signal input.

6 Claims, 5 Drawing Figures

ACTIVE AERIAL

BACKGROUND OF THE INVENTION

The invention relates to an active aerial including an aerial element having a length which is small with respect to the wavelength associated with the operating frequency, and to an amplifier connected to the aerial element.

Such an aerial is disclosed in inter alia the article "Die transistorierte Empfangsantenne mit kapazitiv hochohmigem Verstärker als optimale Lösung für den Empfang niedriger Frequenz" by H. Lindenmeier, published in NTZ 27 (1974) no. 11, pages 411–417, and is used in mobile radio receivers, including car radios, and in what is known as aerial "arrays", in view of its small dimensions, the fact that it has such a large broad-band and the possibility to match the output impedance in a simple way to the characteristic impedance of the cable to a receiver.

Noise and distortion are unavoidable because of the presence of an amplifier, so that an optimum signal-to-noise ratio and a minimum intermodulation must be the aim when designing aerials of this type. Particularly when the aerial is used in the so-called aerial "arrays", it is furthermore important that the aerial transfer function is accurately defined and preferably independent of the frequency, while the influence of atmospherics must be suppressed to the best possible extent.

From the above-mentioned article it appears that the input impedance of the amplifier of the active aerial must be highly resistive.

SUMMARY OF THE INVENTION

It is an object of the invention to provide an active aerial which, by a novel concept, satisfies the requirements impose to a very high extent.

According to the invention, the active aerial mentioned in the opening paragraph is characterized in that the control input of the first active element of the amplifier is virtually connected to ground.

This has the advantage that the input voltage becomes substantially equal to zero, non-linear distortion then being prevented from occurring, that measures taken as a protection from atmospherics, such as static discharges do not affect the aerial transfer function and that the influence of parasitic contamination of the aerial, for example due to dust and rain, is considerably reduced.

In accordance with a preferred embodiment, the active aerial comprises a high-gain amplifier, having a signal input, a signal-inverting input and an output, the signal input being connected to a point of common potential and the signal-inverting input being coupled to the aerial element and the amplifier being negatively fedback by means of a feedback circuit. The input stage of the amplifier may be implemented as a symmetrical differential amplifier.

This has the advantage that an amplifier having a very low-resistance input is provided in a very simple way.

In accordance with a further characteristic feature the feedback circuit includes a first capacitor which is arranged between the output of the amplifier and the signal-inverting input of the amplifier.

Such an active aerial has the advantage that its transfer function is independent of the frequency.

DESCRIPTION OF THE DRAWINGS

The operation of the active aerial and its advantages will now be further explained by way of example with reference to the embodiments shown in the Figures, corresponding elements having been given the same reference numerals.

In the drawings.

DESCRIPTION OF THE PREFERRED EMBODIMENT

Figure 1:
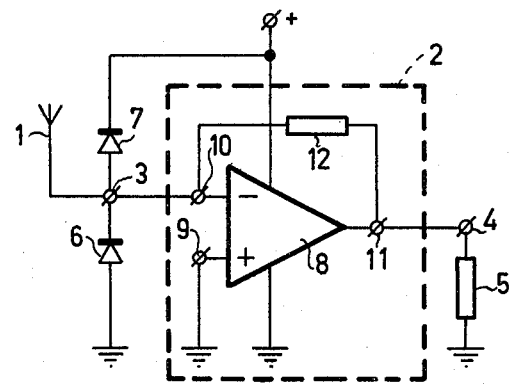
FIG. 1 shows an embodiment of an active aerial according to the invention.

The active aerial shown in FIG. 1 comprises an aerial element 1 whose length is shorter than the wavelength at the operating frequency and an amplifier circuit 2 connected thereto having an input 3 and an output 4 to which a load 5 can be connected.

When the length 1 of this aerial is much less than the wavelength at the operating frequency, such an aerial is particularly suitable for use in mobile receivers and in so-called aerial "arrays". Since these aerials comprise an amplifier, noise and distortion products coming from the amplifier are unavoidable, these products being added to the received signal. The configuration must therefore be of such a design that these unwanted signals are suppressed to the best possible extent. Such an active aerial is provided with diodes 6 and 7 to protect the amplifier input from high voltages as resulting from, for example, static discharges. These diodes 6, 7, which limit the input voltage variation between ground potential and the supply voltage potential have stray capacitances, which reduce the strength of the signal coming from the aerial. Furthermore, the non-linear behavior of the diodes 6,7 increases the distortion of the active aerial. Also contamination of the aerial by dust and moisture produce unwanted impedances which negatively affect the quality of the transfer characteristic of the aerial.

In order to considerably reduce the influence of these effects, the amplifier circuit 2 comprises, in this embodiment, a high-gain amplifier 8 with the signal input 9 of the amplifier 8 connected to a point of common potential, this point being connected to ground in this embodiment. In addition, the amplifier has a feedback circuit which, in this example, is formed by an impedance 12, which is arranged between the output 11 and the signal-inverting input 10 of the amplifier 8. It should be noted that the input stage of the amplifier 8 may be implemented as a symmetrical differential amplifier.

In view of the fact that the gain factor of the amplifier 8 is very high and the output voltage is negatively fedback to the signal-inverting input by way of the feedback impedance 12, the voltage at the signal-inverting input 10 will be substantially equal to the voltage at the signal input 9 and consequently substantially equal to the voltage at the point of common potential.

This means that the signal-inverting input is virtually connected to ground. It should be noted that the signal-inverting input 10 constitutes the control input of the first active element of the amplifier circuit 2. Because of the very small voltage difference between the signal input 9 and the signal inverting input 10, the amplifier circuit 2 has a very low input impedance.

As a result of the fact that the signal-inverting input is virtually connected to ground, there is normally no signal voltage across the protection diodes 6 and 7 and the influence of these diodes on the aerial transfer characteristic is eliminated. The same applies as regards the influence of aerial contamination due to moisture and dust. Also the non-linear distortion of the amplifier is considerably reduced by the fact that the variations in the input voltage is very small.

An aerial having a length which is much less than the wavelength may be represented by a voltage source $U_a$ with which a capacitance $V_a$ is arranged in series. This is proof of the fact that the open voltage produced by the aerial 11 is independent of the frequency.

In order to obtain a frequency-independent active aerial transfer characteristic a capacitance (16) must be chosen as the feedback impedance 12.

It can be demonstrated in a simple manner that in that case the transfer function is equal to $$U_b/U_a = -C_a C_{16} \quad (1)$$

$U_b$ representing the voltage across the load 5. When a variable capacitor $C_{16}$ is used as the feedback impedance 12, then it follows from formula 1 that the gain changes linearly versus the change of the value of this feedback capacitance $C_{16}$, which renders it possible to set in a simple way the desired output voltage for driving the receiver, which is coupled to the active aerial, to full power.

Figure 2:
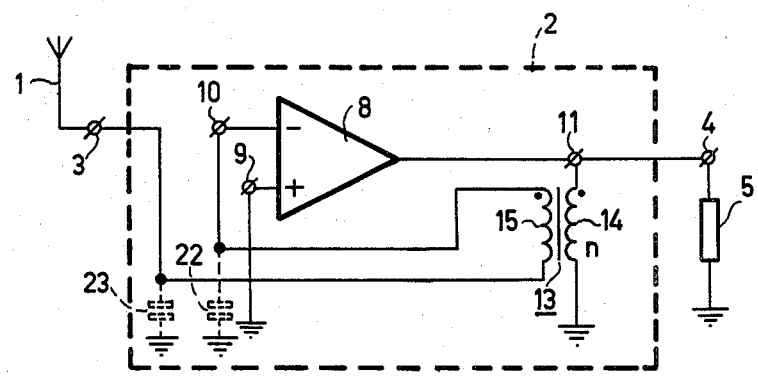
FIG. 2 shows a further embodiment of an active aerial according to the invention.

The embodiment shown in FIG. 2 shows an operational amplifier 8, whose signal input 9 is also connected to ground, as the active portion of the amplifier circuit 2. However, the feedback circuit is formed by a first transformer 13, a first winding 14 of which is connected between the output 4 of the amplifier and ground and a second winding 15 of which is connected between the aerial element and the signal-inverting input 10 of the amplifier 8. For a n:1 ratio for the number of turns of the first winding 14 to the number of turns of the second winding 15 it holds for the transfer function of the aerial at a very high gain factor of the amplifier 8 that the transfer function is equal to $$U_b/U_a = n \quad (2)$$

So also this aerial configuration has a well-defined transfer function which is independent of the frequency.

As the signal inverting input is virtually grounded, the influences of stray capacitances 22, produced for example by the protection diodes connected to the signal inverting input 10, the Miller-capacitance of the first active element of the amplifier 8 and the capacitance of the wiring in the region of the said input 10, are eliminated. Only the parasitic wiring capacitance 23 remains.

In order to obtain an optimal matching of the active aerial to the load 5, which may be formed by, for example, the characteristic impedance of the cable and the input impedance of a receiver, the feedback circuit of the amplifier 12 may be modified.

Figure 3:
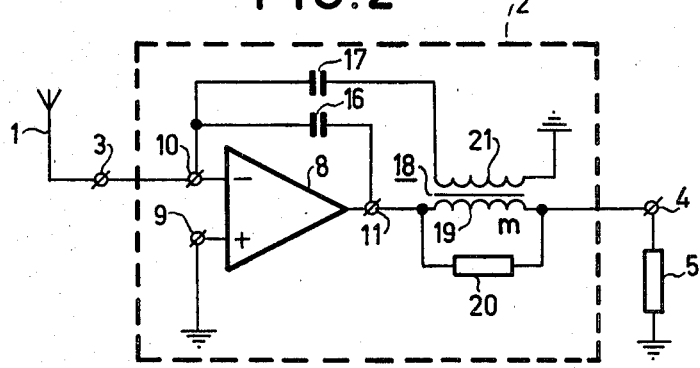
FIG. 3 shows a modification of the active aerial of the embodiment shown in FIG. 1.

Thus, FIG. 3 shows an embodiment in which, in addition to the negative feedback by means of a capacitance 16, this negative feedback being operative in parallel from the output as described with reference to FIG. 1, a negative feedback is operative in series from the output by means of a second transformer 18 and a second capacitor 17. A first winding 19 of the second transformer 18 is connected between the output 11 of the amplifier 8 and the load 5, this winding being shunted by a resistor 20 having a value which is small with respect to the load impedance 5. A second winding 21 of this transformer 18 is connected in series with the second capacitor 17 between the point of common potential (ground) and the signal-inverting input 10 of the amplifier 8. Starting from a m:1 ratio of the number of turns of the first winding 19 to the number of turns of the second winding 21, it can be demonstrated, at a very high gain factor of the amplifier 8, that the voltage $U_b$ across the load 5 is equal to $$U_b/U_a = -C_a \left[ \left( m \frac{R_{20}}{Z_5} C_{17} \right) + \left( 1 + \frac{R_{20}}{Z_5} \right) C_{16} \right] \quad (3)$$

and that the output impedance $Z_o$ of the amplifier 2 is equal to $$Z_o = R_{20}(1 + mC_{19}/C_{16}) \quad (4)$$

Let the load impedance $Z_5$ be equal to $Z_o$ and $$|m^2 R_{20}| << \frac{1}{jwC_{17}} \text{ and } |R_{20} + Z_o| << \frac{1}{jwC_{16}}$$

then formula (3) is simplified to $$U_s/U_a = -C_a/2 \cdot C_{16} \quad (5)$$

As formula (5) shows, the active aerial of in FIG. 3 has a defined, frequency-independent transfer characteristic. In addition, formula (4) shows that by the choice of the value of resistance 20 an optimum power transfer can be obtained in a simple manner, a considerable loss in signal power not occurring.

Figure 4:
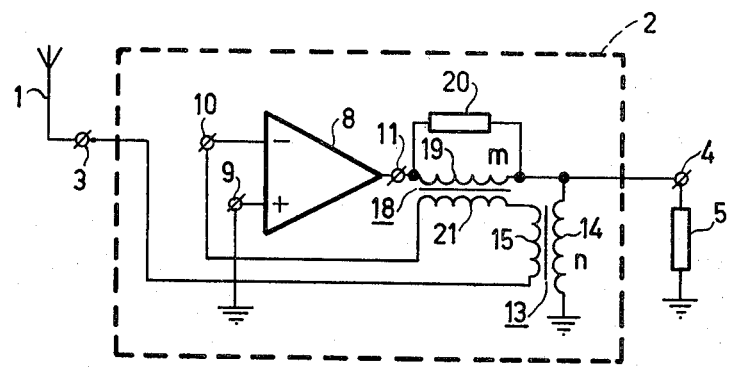
FIG. 4 shows a modification of the active aerial of the embodiment shown in FIG. 2.

The embodiment shown in FIG. 4 shows a feedback circuit in which not only the negative feedback as shown in FIG. 2 is operative from the output but in which there is also an additional negative feedback which is operative in series with the output, in a similar manner as shown in FIG. 3.

The difference between this additional negative feedback and the negative feedback shown in FIG. 3 is that the second winding 21 of the second transformer 18 is connected in series with the second winding 15 of the first transformer 13 between the aerial element 1 and the signal-inverting input 10 of the amplifier 8.

For this active aerial configuration it holds that $$U_b/U_a = Z_5(mZ_{20} + Z_5/n) \quad (6)$$

and that the output impedance $Z_o$ of the amplifier 2 is equal to $$Z_o = m.n.R_{20} \quad (7)$$

For the case where $Z_5 = Z_o$ formula (6) is simplified to $$U_b/U_a = n/2 \quad (8)$$

This formula (8) shows that the active aerial shown in FIG. 4 has a defined and frequency-independent transfer characteristic and that the output impedance of the amplifier 2 can be set in a simple manner by the choice of the value of the resistor 20 and/or the winding ratio of the second transformer 18, in order to obtain an optimum power transfer.

The embodiment shown in FIG. 1 can be wholly implemented in integrated form and is therefore particularly suitable for use in car radios and aerial "arrays".

It appeared that, when the aerial element has a length of 0.5 meter, the described active aerial had, over a frequency band from 5 kHz to 30 MHz, a transfer characteristic which is flat within 0.5 dB and an extremely low distortion, which will be explained with reference to FIG. 5.

Figure 5:
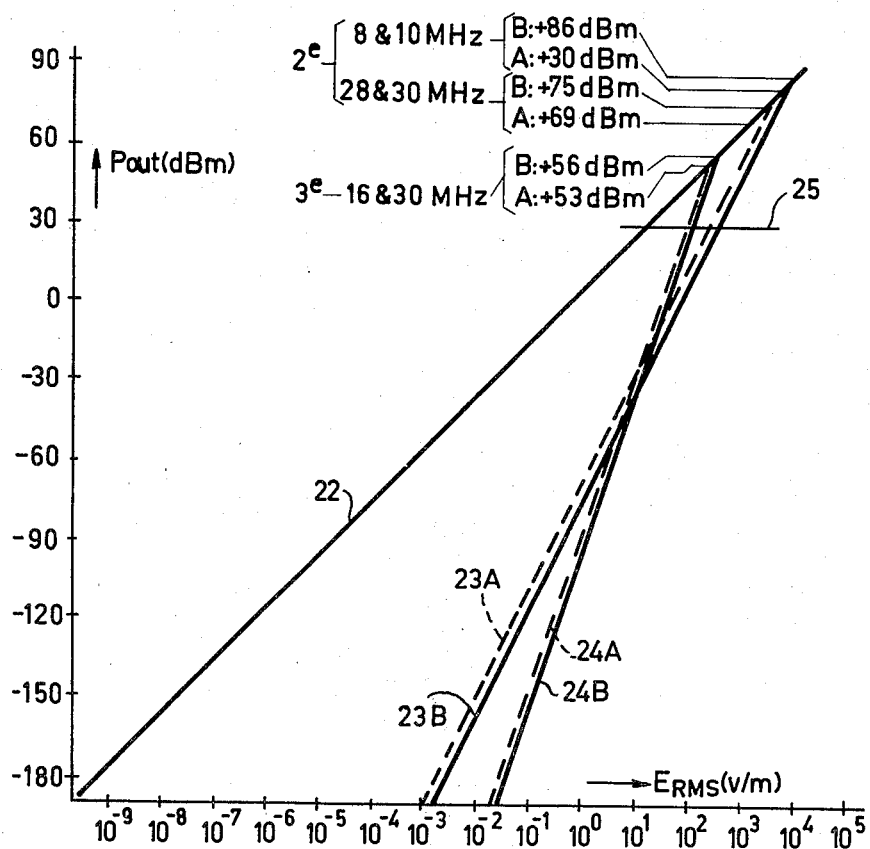
FIG. 5 shows a graph of the output power of the active aerial versus the received signal strength.

In the graph shown in this FIG. 5 the power applied by the active aerial to a 50 Ω load is plotted in dBm versus the root means square value of the received field strength $E_{RMS}$, expressed in V/m. The right-hand line 22 represents the relationship of the desired signal, the straight lines 23A and 23B represent the second order distortion then occurring (indicated in the Figure by $2^{nd}$) and the straight lines 24A and 24B represent the third order distortion then occurring (indicated in the Figure by $3^{rd}$). The indices A and B, respectively, indicate that these lines are associated with the active aerial as shown in FIG. 1 and FIG. 2, respectively. The excitation limit of the active aerial is shown in FIG. 5 by means of line 25.

A criterion by which the quality can be judged, this graph shows that the second order interception point is located above +70 dB m and that the third order interception point is located above +50 dBm.

What is claimed is:

1. An active aerial including an aerial element having a length which is small with respect to the wavelength associated with the operating frequency and an amplifier to which the aerial element is connected, characterized in that said amplifier comprises an active element having a grounded input and a control input to which said aerial element is coupled, means for coupling to said control input to provide a voltage potential at said control input at virtually the same potential as said grounded input.

2. An active aerial as claimed in claim 1, characterized in that the active element is a high-gain amplifier having a signal input representing said grounded input, a signal-inverting input representing said control input and an output, the aerial element being coupled to the signal-inverting input and the amplifier is negatively fed back by means of a feedback circuit included in said coupling means.

3. An active aerial as claimed in claim 2, characterized in that the feedback circuit includes a capacitor arranged between the output of the high-gain amplifier and the signal-inverting input of the high-gain amplifier.

4. An active aerial as claimed in claim 2, characterized in that the feedback circuit comprises a first transformer, a first winding of which is connected between the output of the high-gain amplifier and the point of common potential and a second winding of which is connected between the aerial element and the signal-inverting input of the high-gain amplifier.

5. An active aerial as claimed in claim 3, characterized in that the feedback circuit comprises a transformer, a first winding of which is connected between the output of the high-gain amplifier and a load and a second winding of which is connected between the signal-inverting input and the point of common potential by way of a further capacitor, a resistor being connected in parallel with the first winding.

6. An active aerial as claimed in claim 4, characterized in that the feedback circuit comprises a second transformer, a first winding of which is connected between the output of the amplifier and a load and a second winding of which is connected in series with the second winding of the first transformer, a resistor being connected in parallel with the first winding of said second transformer.

* * * * *